(12) United States Patent
Cho et al.

(10) Patent No.: US 7,736,952 B2
(45) Date of Patent: Jun. 15, 2010

(54) WAFER PACKAGING METHOD

(75) Inventors: Soon-Jin Cho, Suwon-si (KR); Jin-Won Choi, Seoul (KR); Seung-Hyun Cho, Seoul (KR); Chung-Woo Cho, Suwon-si (KR); Dong-Gyu Lee, Suwon-si (KR); Seok-Hwan Ahn, Suwon-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 19 days.

(21) Appl. No.: 12/010,544

(22) Filed: Jan. 25, 2008

(65) Prior Publication Data

US 2009/0087950 A1   Apr. 2, 2009

(30) Foreign Application Priority Data

Sep. 28, 2007   (KR) ............... 10-2007-0098379

(51) Int. Cl.
*H01L 21/00* (2006.01)
*H01L 21/58* (2006.01)

(52) U.S. Cl. ............... 438/113; 257/E21.505

(58) Field of Classification Search ........... 438/107, 438/110, 113
See application file for complete search history.

(56) References Cited

U.S. PATENT DOCUMENTS

| 2001/0026021 | A1* | 10/2001 | Honda ............ 257/778 |
| 2001/0055856 | A1* | 12/2001 | Tao ............... 438/462 |
| 2004/0099943 | A1* | 5/2004  | Meguro et al. ... 257/701 |
| 2006/0073638 | A1* | 4/2006  | Hsu ............... 438/110 |
| 2008/0048310 | A1* | 2/2008  | Zeng ............. 257/690 |

FOREIGN PATENT DOCUMENTS

| JP | 11-307624  | 11/1999 |
| KR | 2006-0007846 | 1/2006 |

OTHER PUBLICATIONS

Korean Office Action issued Aug. 31, 2009 in corresponding Korean Patent Application No. 10-2007-0098379.

* cited by examiner

*Primary Examiner*—W. David Coleman
*Assistant Examiner*—Christine Enad

(57) ABSTRACT

A wafer packaging method is disclosed.

An aspect of the invention is to provide a wafer packaging method comprising;
attaching tape onto one side of a carrier, the carrier having a through-hole formed therein; attaching a wafer onto the tape exposed inside the through-hole such that at least one electrode of the wafer is exposed; and
performing a packaging process on the carrier such that the wafer is packaged.

8 Claims, 34 Drawing Sheets

WAFER PACKAGING METHOD

CROSS-REFERENCE TO RELATED APPLICATIONS

This application claims the benefit of Korean Patent Application No. 10-2607-0098379 filed with the Korean Intellectual Property Office on Sep. 28, 2007, the disclosure of which is incorporated herein by reference in its entirety.

BACKGROUND

1. Technical Field

The present invention relates to a wafer packaging method.

2. Description of the Related Art

Wafer-level packaging method, all processes are progressed as a wafer, is improved actively. But, wafer-level packaging method is very expensive because it uses not only new equipment but also photo-sensitive film.

To reduce the manufacturing cost of packaging, many wafers must be packaged just one full process and use cheep materials during the process. But, we have used just one wafer while packaging process.

Therefore, we need new process to package wafer by using manufacturing process of PCB (Printed Circuit Pattern).

SUMMARY

An aspect of the invention is to provide a wafer packaging method comprising;

attaching tape onto one side of a carrier, the carrier having a through-hole formed therein; attaching a wafer onto the tape exposed inside the through-hole such that at least one electrode of the wafer is exposed; and performing a packaging process on the carrier such that the wafer is packaged.

DETAILED DESCRIPTION

Figure 1:
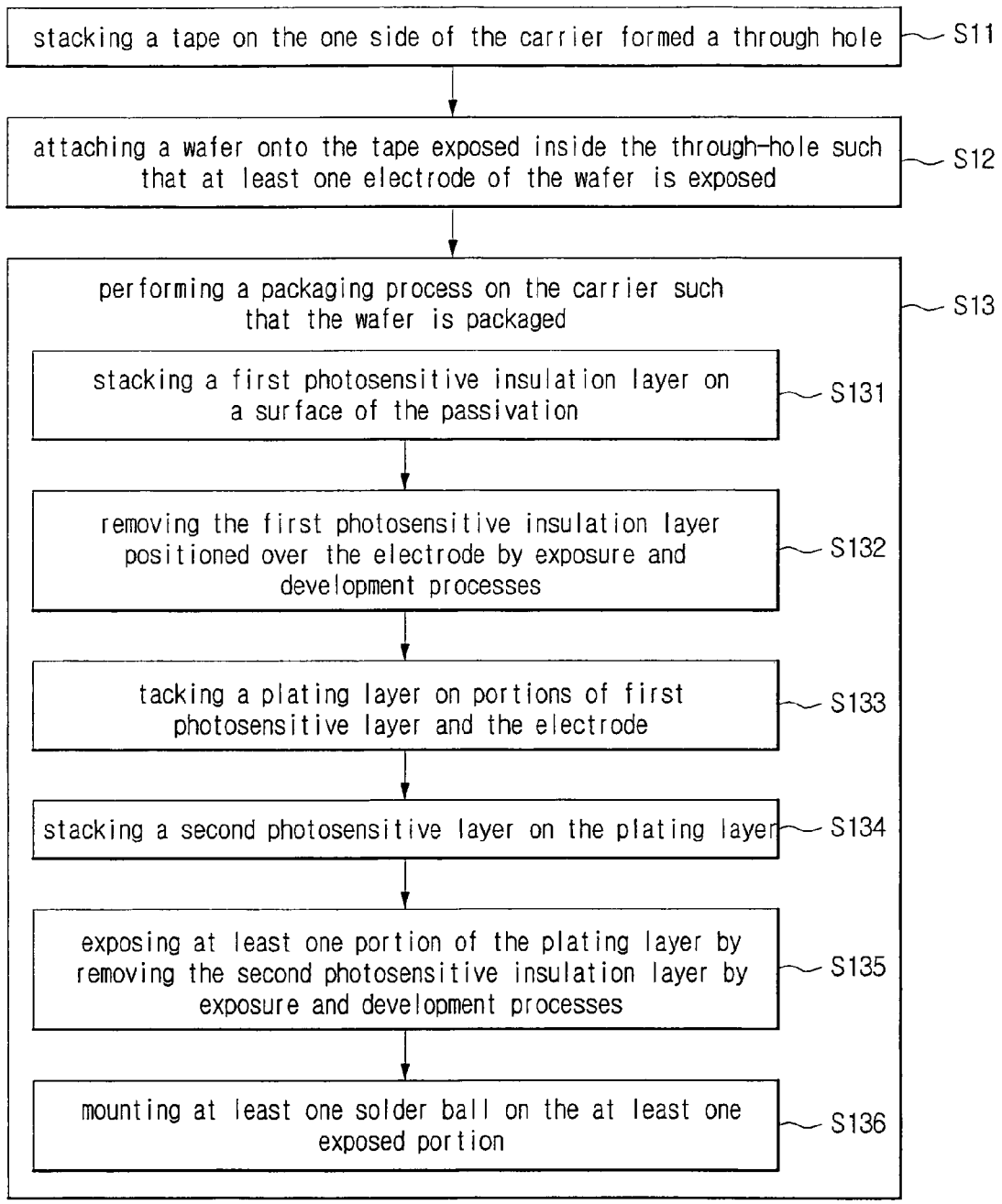
FIG. 1 is a flowchart of a process of a wafer packaging method according to a first disclosed embodiment of the invention.

The wafer packaging method according to certain embodiments of the invention will be described below in more detail with reference to the accompanying drawings, in which those components are rendered the same reference numeral that are the same or are in correspondence, regardless of the figure number, and redundant explanations are omitted.

FIG. 1 is a flowchart of a process of a wafer packaging method. FIG. 2~14 are processes of wafer packaging method. FIG. 2~14 are illustrated, a carrier 11, a through hole 111, a tape 12, a wafer 13, a chip 131, a silicon-layer 1311, a passivation 1312, an electrode 1313, a first photosensitive insulation layer 141, a dry film 142, a second photosensitive layer 143, a seed layer 151, a plating layer 16, a UBM (under bump metal) 17, a solder ball 18.

Figure 2:
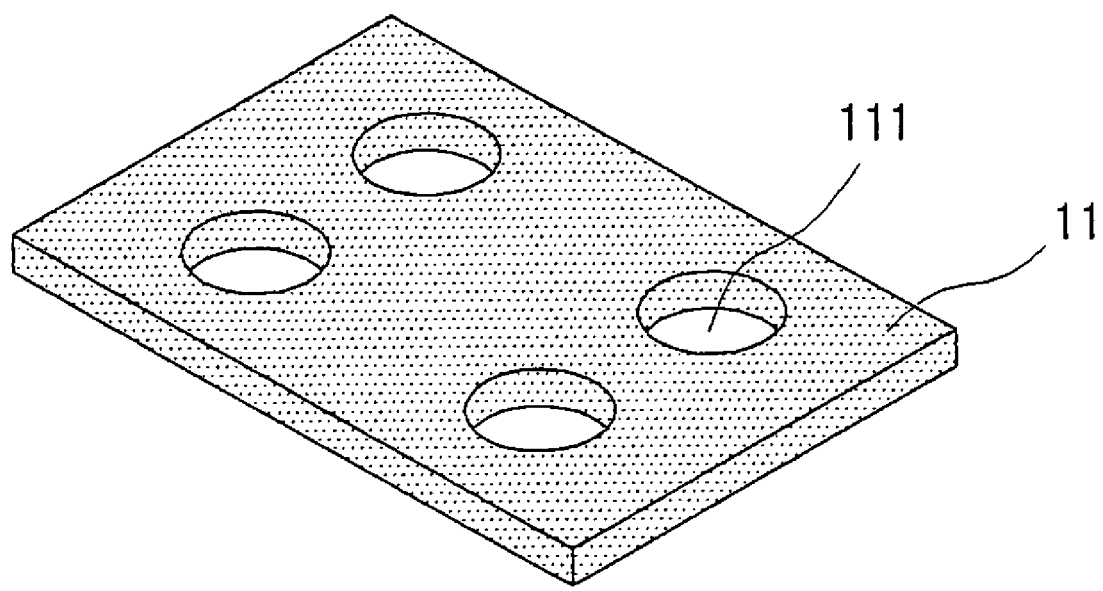
FIG. 2~14 are processes of wafer packaging method according to a first disclosed embodiment of the invention.
Figure 3:
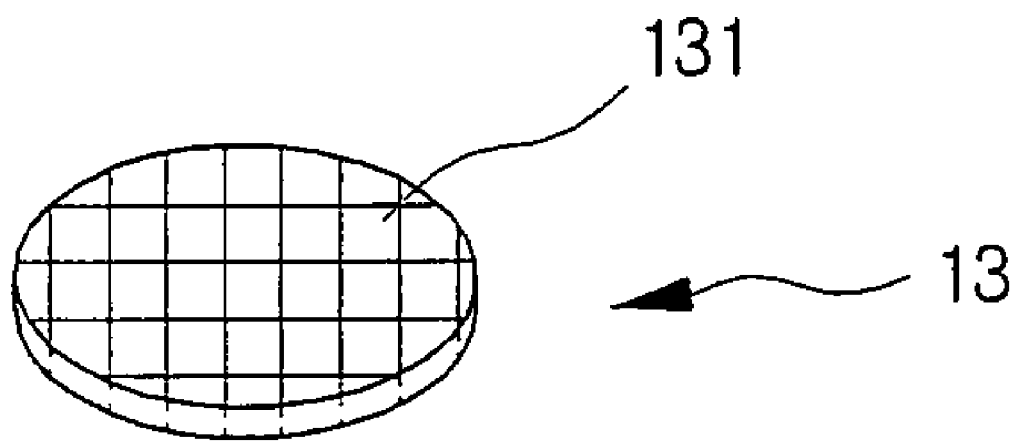
Figure 4:
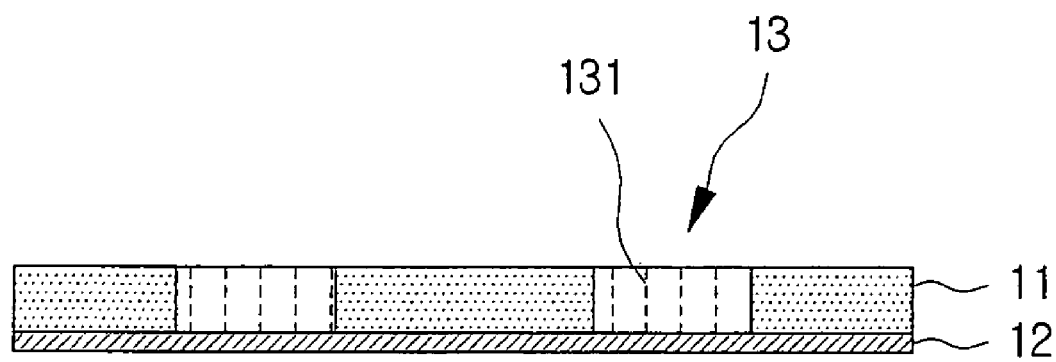

Operation S11 of FIG. 1 may be to attach tape onto one side of a carrier, the carrier having a through-hole formed therein, where FIG. 2~4 represent the corresponding processes.

The carrier 11 may be metal board such as aluminum, copper, nickel and stainless steel. The carrier 11 also may be CCL (Copper Clad Laminate). The carrier 11 has at least one of the through hole 111, and the through hole 111 can be containable the wafer 13 of FIG. 4. FIG. 2 illustrates the carrier formed the through-hole 111. The through-hole 111 may be plural.

The tape 12 is attached on the one side of the carrier 11 as shown in FIG. 4. The tape 12 has a role as fixing the wafer 13 on following process. A metal sheet may be attached to the under part of the tape 12 to support the tape 12.

Operation S12 may be to attach a wafer onto the tape exposed inside the through-hole such that at least one electrode of the wafer is exposed.

As shown in FIG. 3, The wafer 13 is a collection of plurality of chip 131.

The wafer 13 can be inserted in the through-hole 111 of FIG. 2. At this time, the tape 12 is attached on the one side of the carrier 11. The wafer 13 can be attached to the tape 12 in the through-hole 111. The space, between the wafer 13 and through-hole 111, can be filled by filler.

It would be desirable that the size of the through-hole 111 is as same as the wafer 13 such that the wafer 13 can not be moved during the others operation.

Operation S13 of FIG. 1 may be to perform a packaging process on the carrier such that the wafer is packaged, where FIG. 5~14 represent the corresponding processes.

FIG. 5~14 illustrated only a chip 131, but the packaging process will be applied all the chips in the wafers in FIG. 4.

Figure 5:
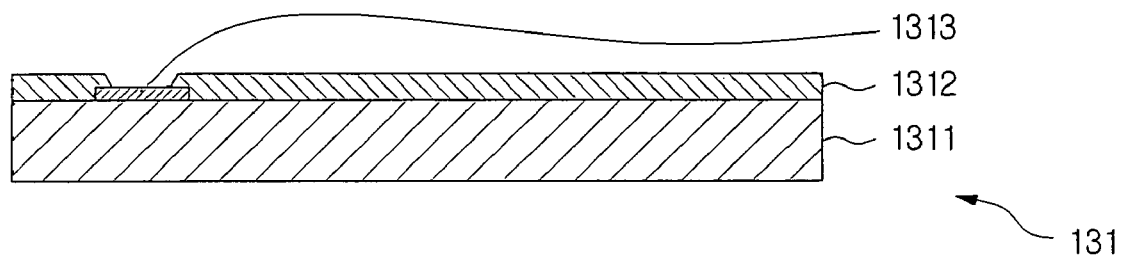

As shown in FIG. 5, the chip 131 has the silicon layer 1311 formed electrode 1313, and the passivation 1312 is stacked on the silicon layer 1311 except the electrode 1313.

Operation S13 may be progressed through the operation S131~S136 in detail.

Figure 6:
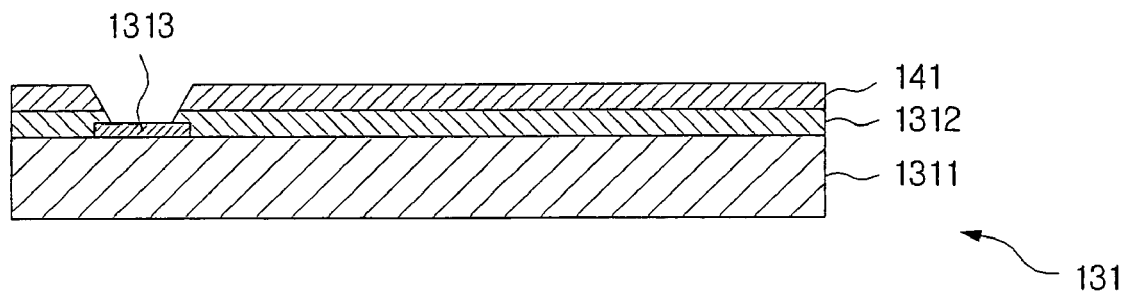
Figure 7:
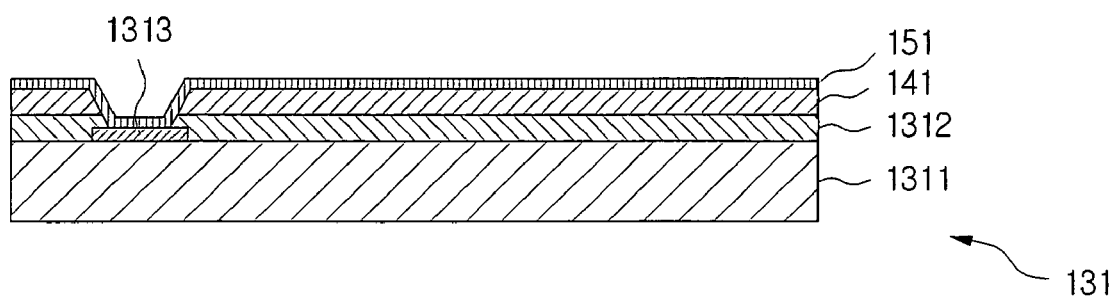

Operation S131 may to stack a first photosensitive insulation layer on a surface of the passivation, operation S132 may to remove the first photosensitive insulation layer positioned over the electrode by exposure and development processes, FIG. 6 represents the corresponding processes.

The packaging process is applied while attaching the wafer 13 on the carrier 11 as shown in FIG. 4. Therefore, operation S131~S136 would be applied to all the wafers attached on the carrier 11.

To explain in detail, FIG. 6 is a cross-sectional view of the chip 131 of the wafer 13. The first photosensitive insulation layer 141 reacts to the light. As shown in FIG. 6, the first photosensitive insulation layer 141 on the electrode 1313 can be removed after exposure and development.

Operation S133 may be to stack a plating layer on portions of first photosensitive layer and the electrode, FIG. 7~11 represent the corresponding processes.

Figure 9:
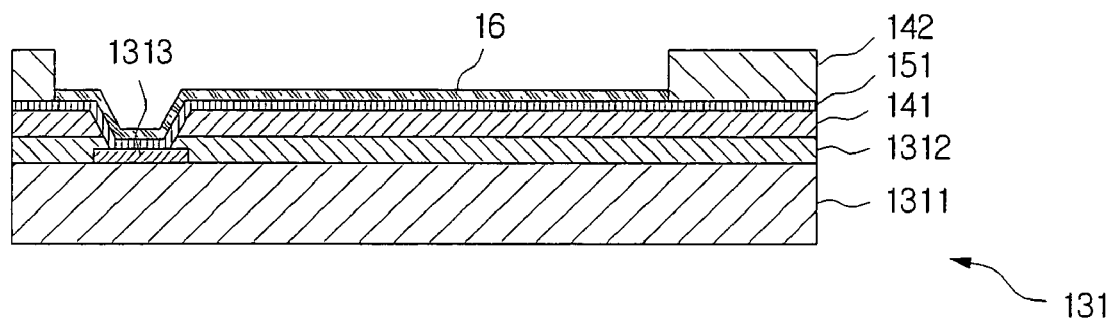
Figure 10:
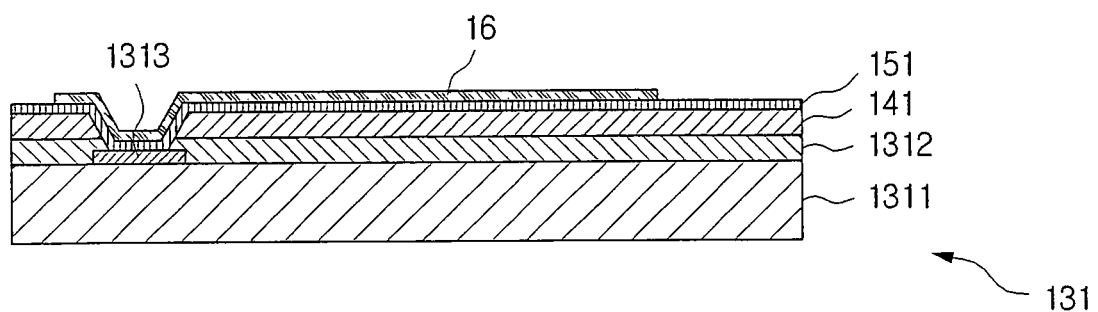
Figure 11:
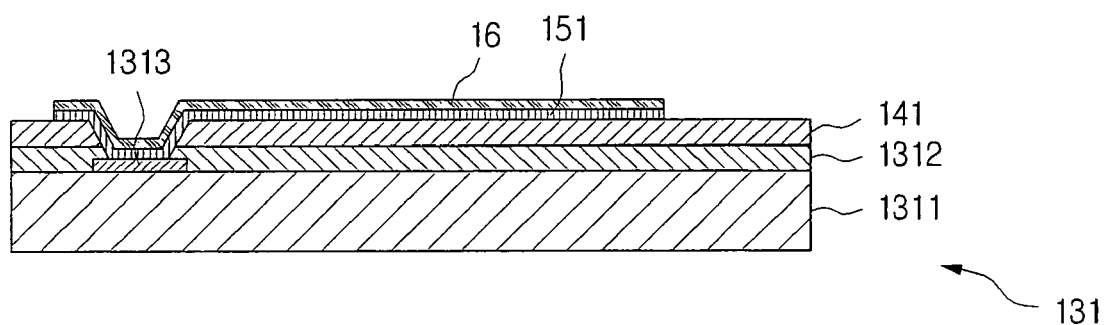

The plating layer 16 of FIG. 9 would be used as electrode 1313 to redistribute. The plating layer 16 may be a copper.

For applying the operation S133, the seed layer 151 can be stacked on the first photosensitive insulation layer 141. The seed layer may be materials such as alloy of titanium and copper, alloy of aluminum and copper, and alloy of chrome and copper.

Figure 8:
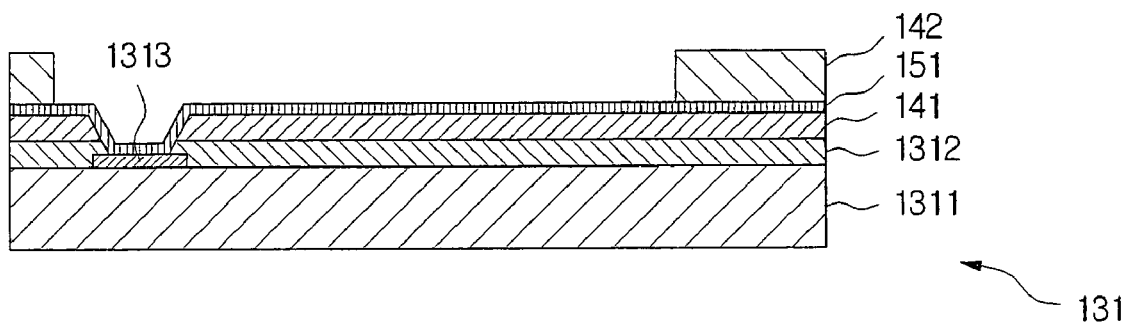

Hereafter, the photosensitive dry film 142 is attached on the seed layer 151 as shown in FIG. 8, and then only the plating layer 16 would be opened by development. And then the plating layer 16 would be stacked by electroplating as shown in FIG. 9. The chip 131 of FIG. 11 would be completed by removing the seed layer 151 after removing the dry film 142.

Figure 12:
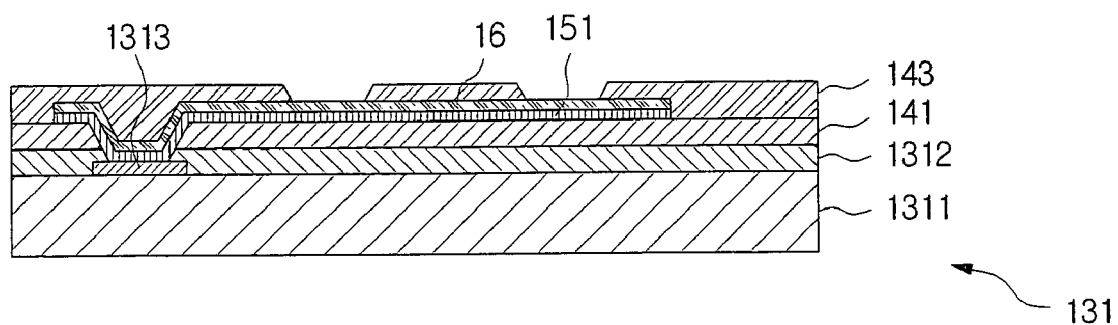
Figure 13:
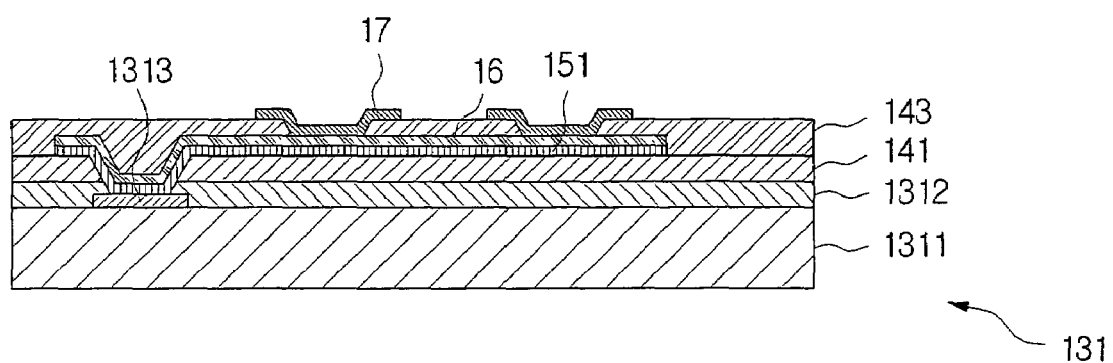
Figure 14:
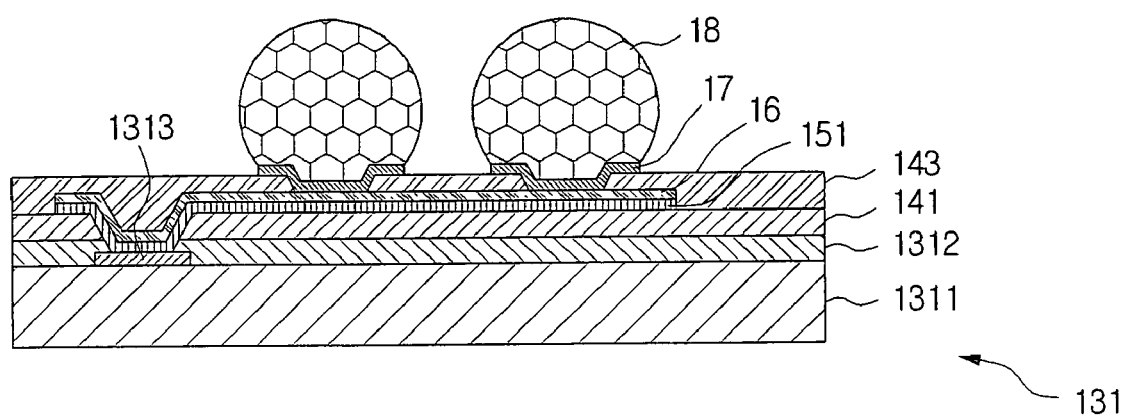

Operation S134 may be to stack a second photosensitive layer on the plating layer, and operation S135 may be to expose at least one portion of the plating layer by removing the second photosensitive insulation layer by exposure and development processes, FIG. 12 represents the corresponding processes.

The pad of the plating layer 16 can be protected by stacking the second photosensitive layer 143. The space for solder ball would be opened by exposure and development at the portions of the second photosensitive insulation layer 143.

Operation S136 may be to mount at least one solder ball on the at least one exposed portion. A UBM (under bump metal) may be used on the second photosensitive insulation layer 143 before operation S136 to broad the space for attaching the solder ball 18.

Hereafter, a dicing process can be applied by separating the chips in the wafer. The chips packaged can be attainable after dicing.

Figure 15:
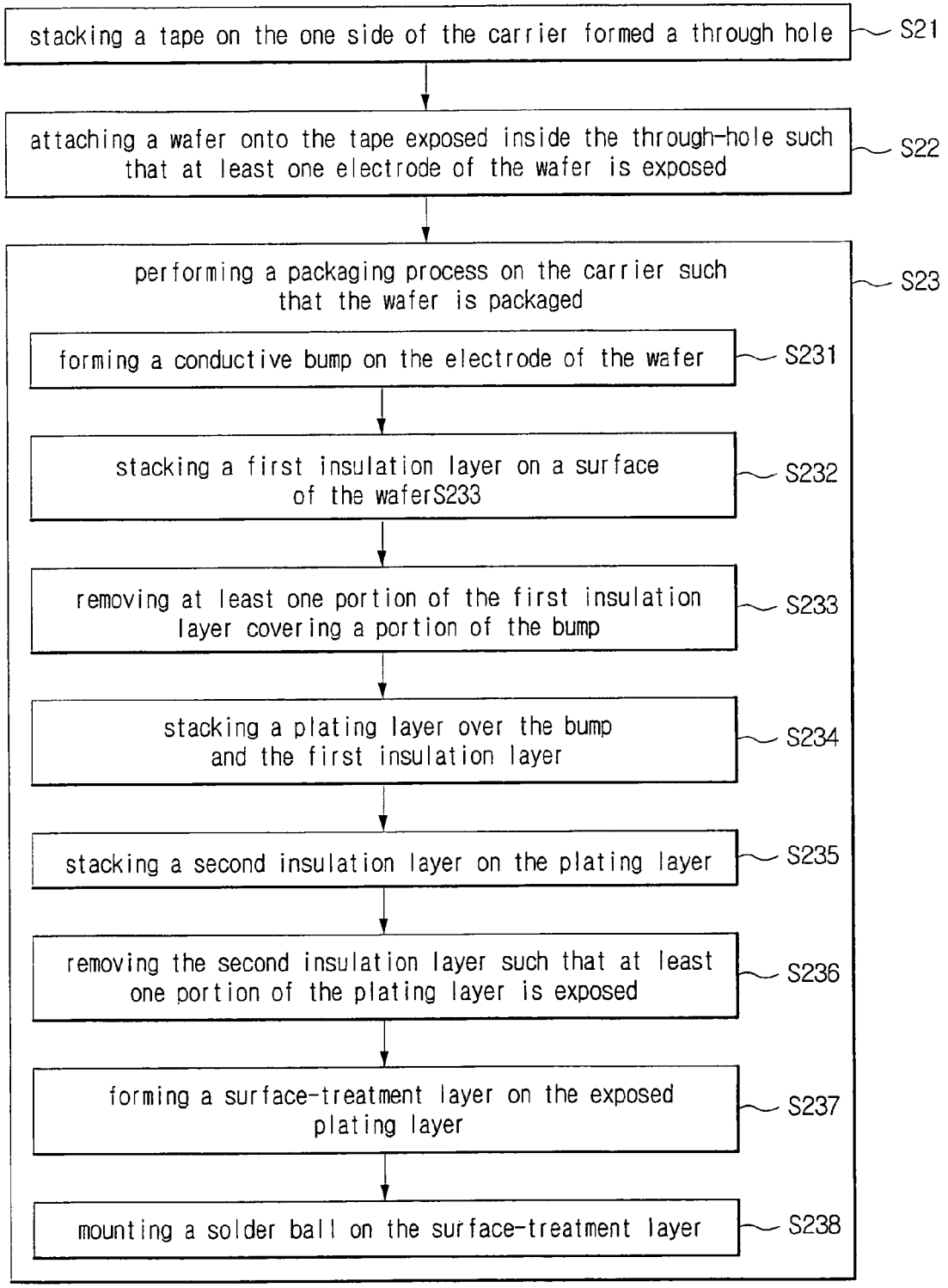
FIG. 15 is a flowchart of a process of a wafer packaging method according to a second disclosed embodiment of the invention.

FIG. 15 is a flowchart of a process of a wafer packaging method. FIG. 16-34 are processes of a wafer packaging method. FIG. 16~34 are illustrated, a carrier 21, a through-hole 211, a tape 22, a wafer 23, a chip 231, a silicon layer 2311, a passivation 2312, an electrode 2313, a first dry film 251, a bump 26, a second dry film 252, a first insulation layer 271, a second insulation layer 272, a first seed layer 241, a second seed layer 242, a plating layer 281, a surface-treatment layer 29, a solder ball 31.

Figure 16:
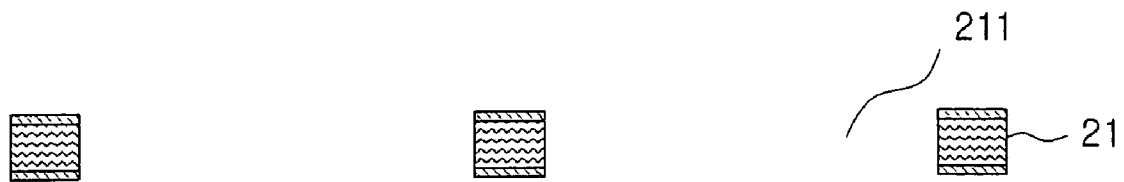
FIG. 16~34 are processes a wafer packaging method according to a second disclosed embodiment of the invention.
Figure 17:
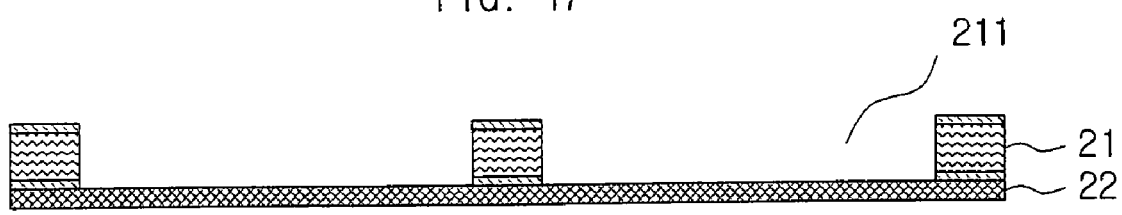

Operation S21 may be to attach tape onto one side of a carrier, the carrier having a through-hole formed therein, FIGS. 16 and 17 represent the corresponding processes The carrier 21 may be a metal board such as aluminum, copper, nickel, stainless steel. The carrier may be CCL (Copper Clad Laminate). The carrier 21 has at least one of the through hole 211, and the through hole 211 can be containable the wafer 23 of FIG. 4. The tape 22 may be attached on the one side of the carrier 21. The tape 22 fixes the wafer 23 on following operation.

Figure 18:
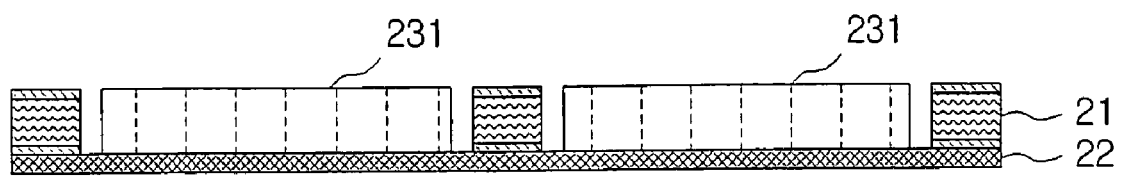
Figure 19:
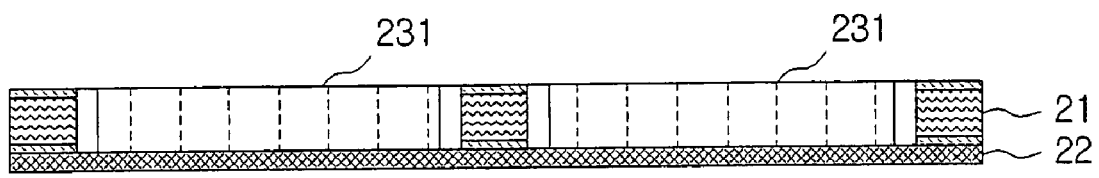

Operation S22 may be to attach a wafer onto the tape exposed inside the through-hole such that at least one electrode of the wafer is exposed, FIGS. 18 and 19 represent the corresponding processes.

The wafer 23 may be a collection of plurality of chips that semi-conductors are integrated.

The wafer 23 may be inserted in the through-hole 111 of FIG. 2. At this time, the tape 22 is attached on the one side of the carrier 21. The wafer 23 can be attached on the tape 22 in the through-hole 211.

It would be desirable that the size of the through-hole 211 is as same as the wafer 23 such that the wafer 23 can not be moved during the operation. And the space, between the wafer 23 and through-hole 211, can be filled by filler.

Operation S23 may be to perform a packaging process on the carrier such that the wafer is packaged, where FIG. 20~34 represent the corresponding processes.

FIG. 20~34 illustrated only one chip 231, but the packaging process will be applied to all the chips in the wafers.

The chips 231 has the silicon layer 2311 formed the electrode 2313, and the passivation 2312 is stacked on the silicon layer 2311 except the electrode 2313. The passivation may be consisted of polyimide or silicon oxinitride.

Operation S23 can be progressed in detail through operation S231~S238.

Figure 24:
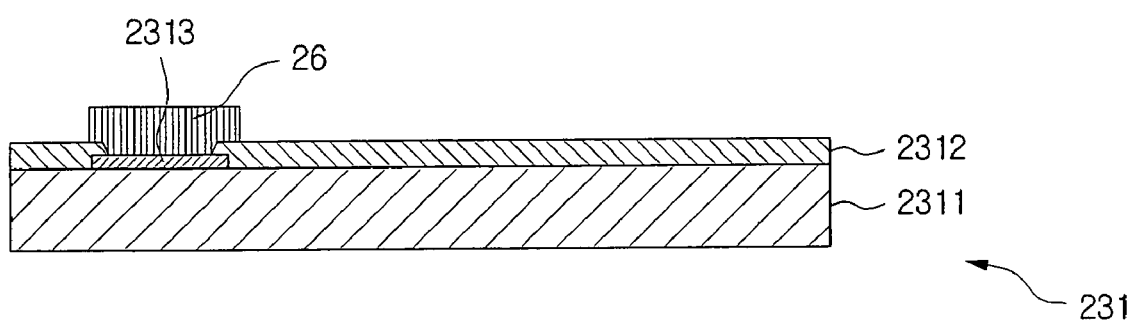

Operation S231 may be to form a conductive bump on the electrode of the wafer, FIG. 20~24 represent the corresponding processes. FIG. 24 illustrates only a chip 231, but every wafer 23 of FIG. 19 attached in the carrier 21 also can be applied with same process.

Figure 20:
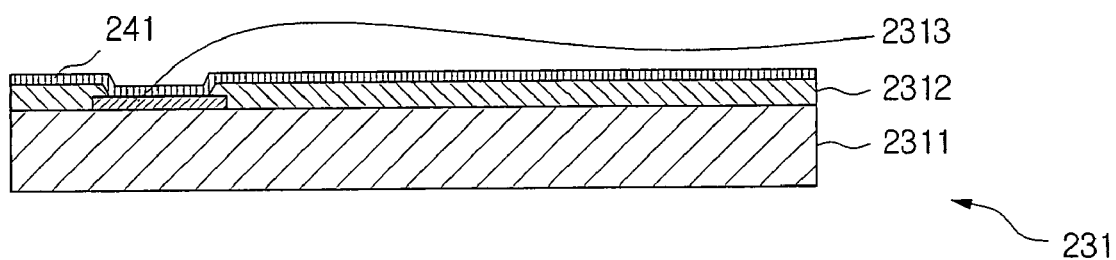

The process of FIG. 20 illustrates stacking the first seed layer 241 on the chip 231. The first seed layer 241 is a conductive material for electroplating.

Figure 21:
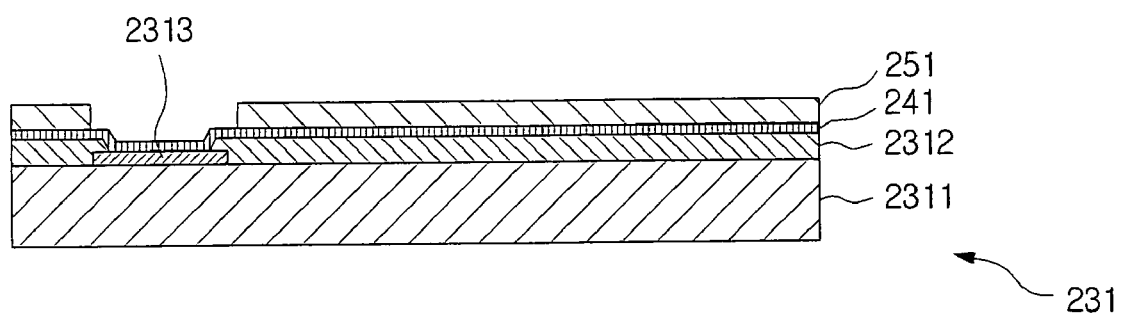

The process of FIG. 21 is stacking the first dry film 251 on the first seed layer 241, and opening the first dry film 251 by exposure and development. The dry film is photo-sensitive material.

Figure 22:
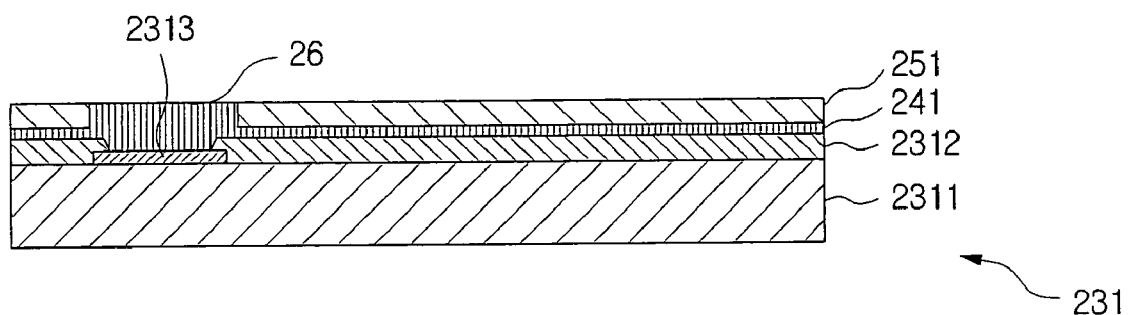
Figure 23:
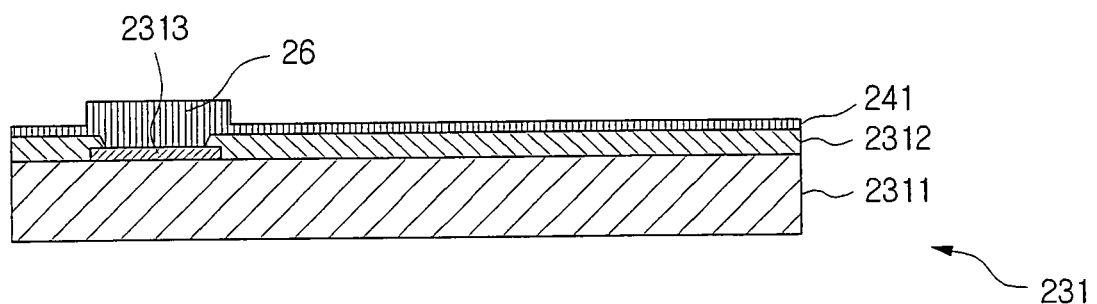

The conductive bump 26 in FIG. 22 may be formed by electroplating on the electrode 2313. The chip 231 of FIG. 24 would be attainable by removing the first dry film 241 and the seed layer 241.

Meanwhile, the bump 26 may be formed by electroless plating. A metal such as Ni or Cu may be used while applying electroless plating The bump 26 can protect the electrode 2313 on following process.

Figure 25:
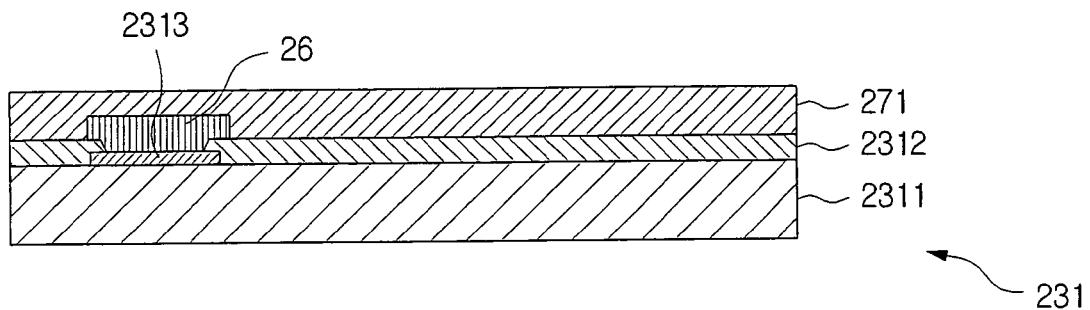

Operation S232 may be to stack a first insulation layer on a surface of the wafer, FIG. 25 represent the corresponding processes.

The first insulation layer 271 may be resin, or resin and supporting materials, and the supporting materials can be used as ceramic filler (such as $SiO_2$) and glass fiber. The first insulation layer 271 used as non-photosensitive material is economical.

Figure 26:
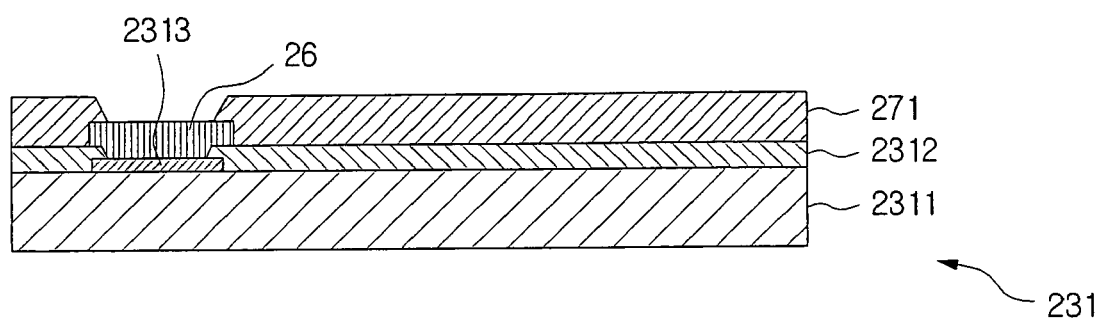

Operation S233 may be to remove at least one portion of the first insulation layer covering a portion of the bump, FIG. 26 represents the corresponding processes. The first insulation layer 271 can be removed by using laser. As a result, the bump 26 can be exposed as shown in FIG. 26.

Figure 27:
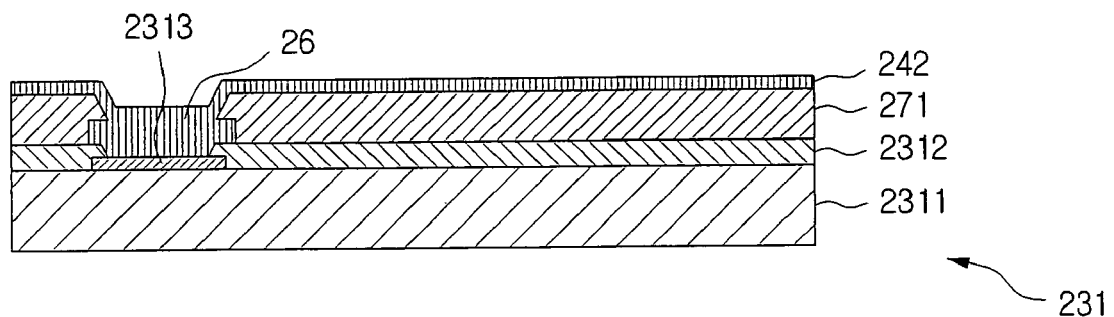
Figure 28:
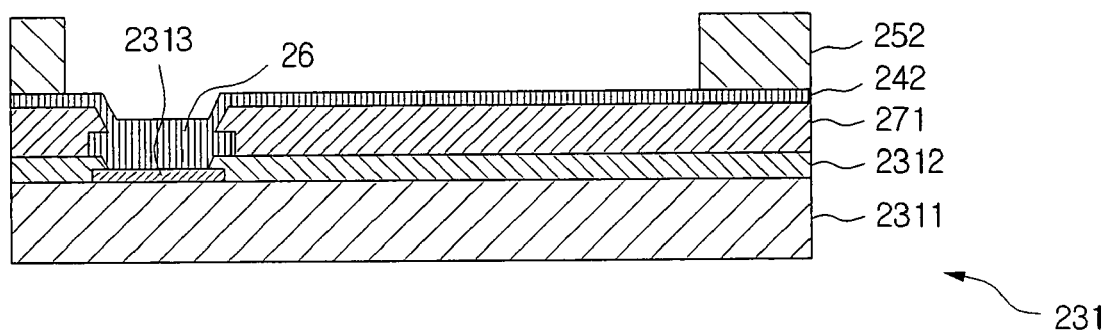
Figure 29:
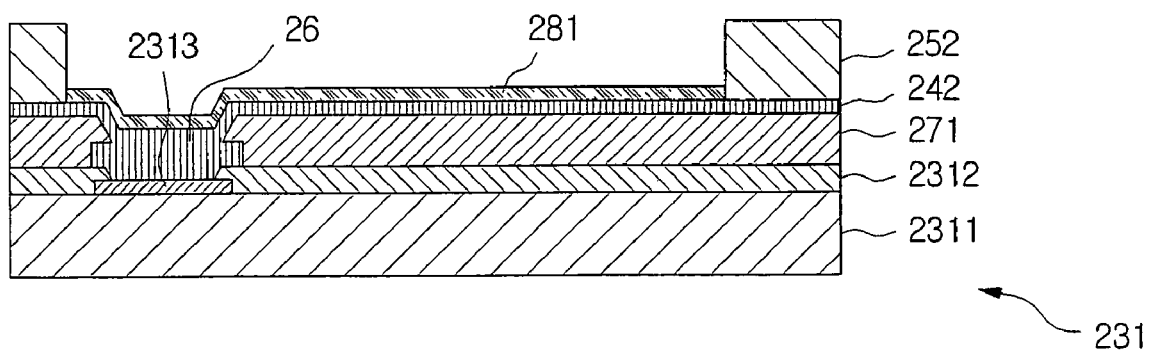

Operation S234 may be to stack a plating layer over the bump and the first insulation layer, FIG. 27~30 represent the corresponding processes. The second seed layer 242 may be stacked on the first insulation layer 271 and the bump 26 as shown in FIG. 27. And then, exposure and development process would be applied after the second dry film 252 is stacked on the second seed layer 242 as shown in FIG. 28. The plating layer 281 can be formed by electroplating as shown in FIG. 29.

Figure 30:
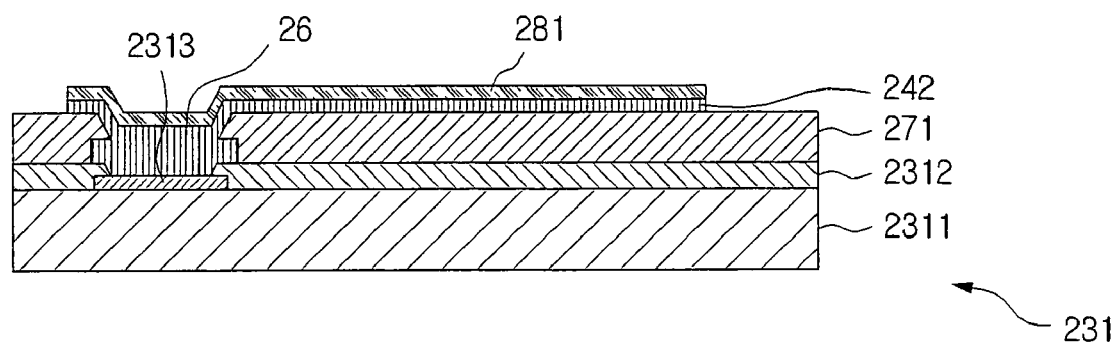

Hereafter, the chip 231 of FIG. 30 may be formed by removing the second dry film 252 and by removing the second seed layer 242 opened.

Figure 31:
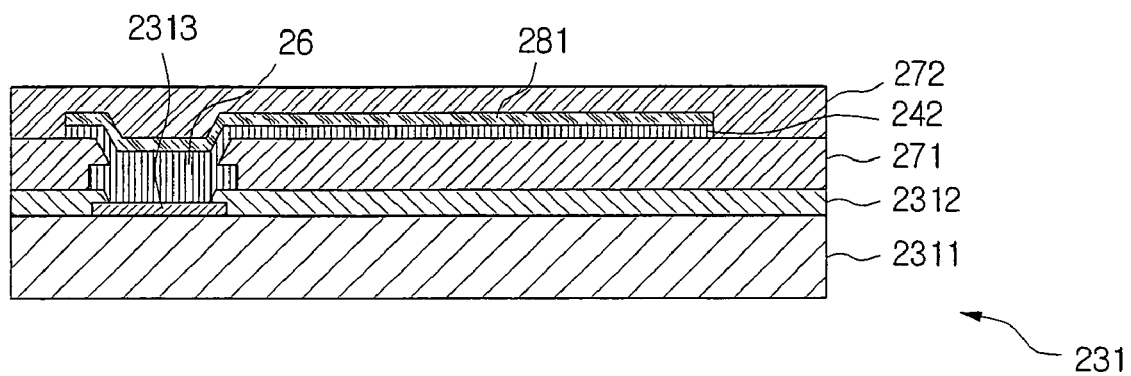

Operation S235 may be to stack a second insulation layer on the plating layer, FIG. 31 represents the corresponding processes. The second insulation layer 272 can be used as same as materials with first insulation layer 271.

Figure 32:
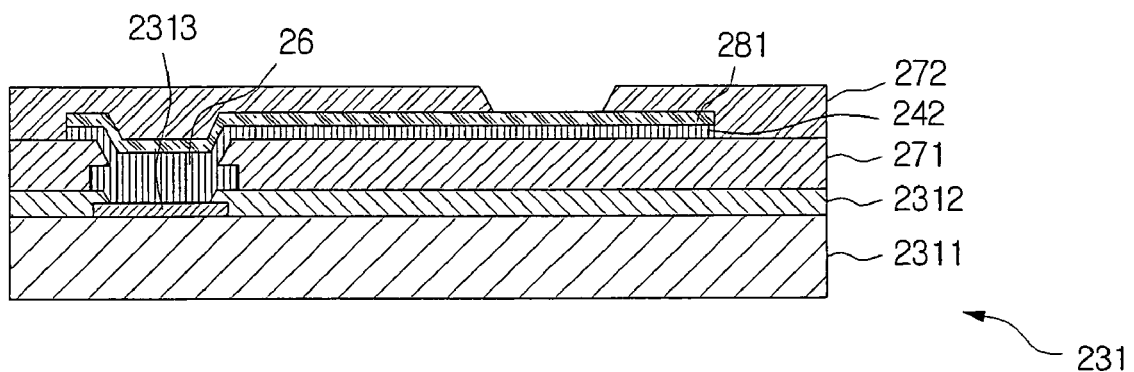

Operation S236 may be to remove the second insulation layer such that at least one portion of the plating layer is exposed, FIG. 32 represents the corresponding processes. The second insulation layer 272 can be removed by laser. The solder ball 31 can be attached to the exposed plating layer 281. Therefore, the plating layer 281 must be opened with proper wide for solder ball 31.

Figure 33:
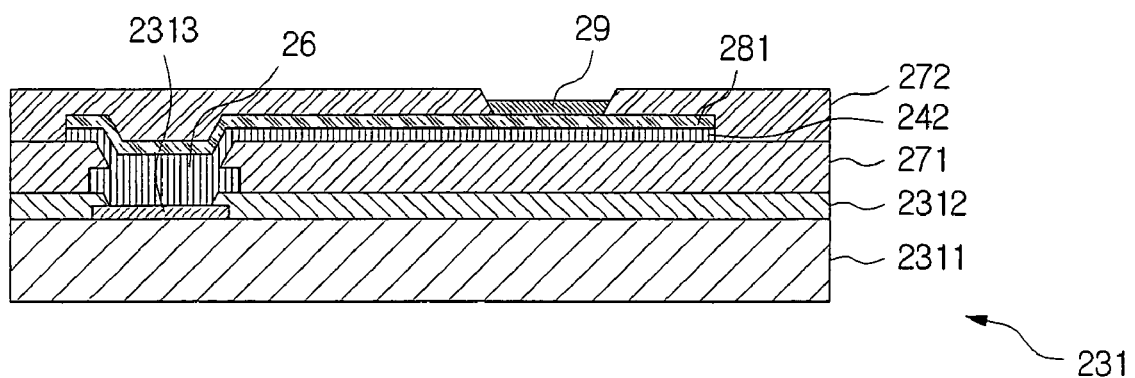
Figure 34:
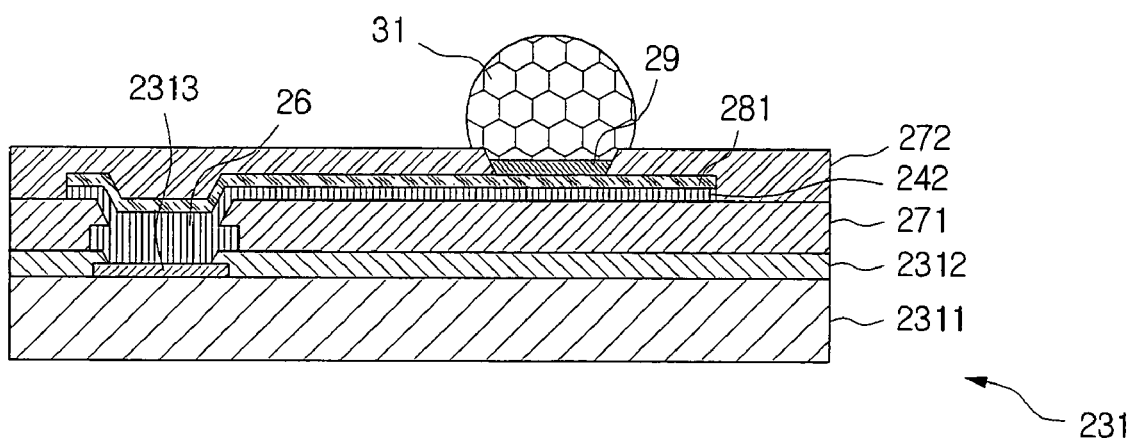

Operation S237 may be to form a surface-treatment layer on the exposed plating layer, FIG. 33 represents the corresponding processes. The surface-treatment layer 29 can be plated to protect the exposed plating layer 281 and to increase adhesion of the solder ball 31.

Operation S238 may be to mount a solder ball on the surface-treatment layer. The solder ball 31 is attached on the surface-treatment layer 29 while reflowing.

As shown in above passage, all the wafers attached in the carrier is treated by the process of this embodiment.

Hereafter, a dicing process can be applied for separating the chips in the wafer. The chips packaged can be attainable after dicing.

As set forth above, certain embodiments of the invention can provide a wafer packaging method, which improves the productivity of wafer because of using the manufacturing process of PCB. And this packaging method is cheep because of applying electroless plating substituting for spurtering, and using non-photosensitive materials.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A wafer packaging method comprising:
    attaching tape onto one side of a carrier, the carrier having a through-hole formed therein;
    attaching a wafer onto the tape exposed inside the through-hole such that at least one electrode of the wafer is exposed, the wafer being a collection of a plurality of chips;
    performing a packaging process on the carrier such that the wafer is packaged;
    separating the wafer from the carrier; and
    dicing the wafer to separate the wafer into a plurality of chips.

2. The wafer packaging method of claim 1, wherein a passivation is stacked on one side of the wafer such that the electrode is exposed, and
    attaching the wafer comprises attaching the other side of the wafer onto the tape.

3. The wafer packaging method of claim 2, wherein the packaging process comprises:
    stacking a first photosensitive insulation layer on a surface of the passivation;
    removing the first photosensitive insulation layer positioned over the electrode by exposure and development processes;
    stacking a plating layer on portions of first photosensitive layer and the electrode;
    stacking a second photosensitive layer on the plating layer;
    exposing at least one portion of the plating layer by removing the second photosensitive insulation layer by exposure and development processes; and
    mounting at least one solder ball on the at least one exposed portion.

4. The wafer packaging method of claim 3, further comprising, between the exposing and the mounting:
    coating a UBM (under-bump metal) over the exposed plating layer.

5. The wafer packaging method of claim 2, wherein the packaging process comprises:
    forming a conductive bump on the electrode of the wafer;
    stacking a first insulation layer on a surface of the wafer;
    removing at least one portion of the first insulation layer covering a portion of the bump;
    stacking a plating layer over the bump and the first insulation layer;
    stacking a second insulation layer on the plating layer;
    removing the second insulation layer such that at least one portion of the plating layer is exposed;
    forming a surface-treatment layer on the exposed plating layer; and
    mounting a solder ball on the surface-treatment layer.

6. The wafer packaging method of claim 5, wherein the first and second insulation layers are made of non-photosensitive material.

7. The wafer packaging method of claim 5, wherein forming the conductive bump is performed by electroplating.

8. The wafer packaging method of claim 5, wherein forming the conductive bump is performed by electroless plating.

* * * * *

UNITED STATES PATENT AND TRADEMARK OFFICE
CERTIFICATE OF CORRECTION

PATENT NO. : 7,736,952 B2
APPLICATION NO. : 12/010544
DATED : June 15, 2010
INVENTOR(S) : Soon-Jin Cho et al.

It is certified that error appears in the above-identified patent and that said Letters Patent is hereby corrected as shown below:

Column 1, Line 7 delete "10-2607-0098379" and insert -- 10-2007-0098379 --.

Signed and Sealed this

Seventh Day of December, 2010

David J. Kappos
*Director of the United States Patent and Trademark Office*